United States Patent [19]
Yamazaki et al.

[11] Patent Number: 5,917,225
[45] Date of Patent: *Jun. 29, 1999

[54] INSULATED GATE FIELD EFFECT TRANSISTOR HAVING SPECIFIC DIELECTRIC STRUCTURES

[75] Inventors: Shunpei Yamazaki, Tokyo; Hongyong Zhang; Yasuhiko Takemura, both of Kanagawa, all of Japan

[73] Assignee: Semiconductor Energy Laboratory Co., Ltd., Kanagawa-ken, Japan

[ * ] Notice: This patent is subject to a terminal disclaimer.

[21] Appl. No.: 08/721,052

[22] Filed: Sep. 26, 1996

Related U.S. Application Data

[62] Division of application No. 08/460,560, Jun. 2, 1995, abandoned, which is a division of application No. 08/037,162, Mar. 25, 1993, Pat. No. 5,468,987, which is a continuation-in-part of application No. 07/846,164, Mar. 5, 1992, Pat. No. 5,289,030.

[30] Foreign Application Priority Data

| Mar. 27, 1992 | [JP] | Japan | 4-102202 |
| Apr. 6, 1992 | [JP] | Japan | 4-113027 |
| Apr. 17, 1992 | [JP] | Japan | 4-124324 |

[51] Int. Cl.⁶ ............................................. H01L 31/0392
[52] U.S. Cl. ..................... 257/411; 257/347; 257/72; 438/216; 438/287; 438/591
[58] Field of Search .................. 257/410, 411, 257/72, 59, 406, 347; 438/151, 216, 287, 591

[56] References Cited

U.S. PATENT DOCUMENTS

| 4,015,281 | 3/1977 | Nagata et al. | 257/347 |
| 4,042,945 | 8/1977 | Lin et al. | 257/405 |

(List continued on next page.)

FOREIGN PATENT DOCUMENTS

| 3-038278 | 3/1978 | Japan | 257/368 |
| 5881972 | 7/1981 | Japan | 257/66 |
| 58-23479 | 2/1983 | Japan | . |
| 58-32466 | 2/1983 | Japan | 437/187 |
| 58-106861 | 6/1983 | Japan | . |
| 58-115864 | 7/1983 | Japan | 257/66 |
| 58-124273 | 7/1983 | Japan | 257/66 |
| 58-158967 | 9/1983 | Japan | 257/66 |
| 60-245173 | 12/1985 | Japan | . |
| 62-124769 | 6/1987 | Japan | 257/59 |

(List continued on next page.)

OTHER PUBLICATIONS

IBM Technical Disclosure Bulletin "Method To Fabricate CMOS On Insulator", vol. 28, No. 7, Dec. 1985, pp. 3120–3122, Dec. 1993.

*Primary Examiner*—David B. Hardy
*Attorney, Agent, or Firm*—Sixbey, Friedman, Leedom & Ferguson, PC; Eric J. Robinson

[57] ABSTRACT

In a thin-film insulated gate type field effect transistor having a metal gate in which the surface of the gate electrode is subjected to anodic oxidation, a silicon nitride film is provided so as to be interposed between the gate electrode and the gate insulating film to prevent invasion of movable ions into a channel, and also to prevent the breakdown of the gate insulating film due to a potential difference between the gate electrode and the channel region. By coating a specific portion of the gate electrode with metal material such as chrome or the like for the anodic oxidation, and then removing only the metal material such as chrome or the like together with the anodic oxide of the metal material such as chrome or the like, an exposed portion of metal gate (e.g. aluminum) is formed, and an upper wiring is connected to the exposed portion. Further, an aluminum oxide or silicon nitride is formed as an etching stopper between the gate electrode and the gate insulating film or between the substrate and the layer on the substrate, so that the over-etching can be prevented and the flatness of the element can be improved. In addition, a contact is formed in no consideration of the concept "contact hole".

43 Claims, 9 Drawing Sheets

U.S. PATENT DOCUMENTS

| | | | |
|---|---|---|---|
| 4,468,855 | 9/1984 | Sasaki | 257/368 |
| 4,485,393 | 11/1984 | Kumamaru et al. | 257/640 |
| 4,557,036 | 12/1985 | Kyuragi et al. | 257/412 |
| 4,746,628 | 5/1988 | Takafuji et al. | 437/187 |
| 4,866,498 | 9/1989 | Myers | 257/405 |
| 4,905,066 | 2/1990 | Dohjo et al. | 257/412 |
| 5,041,888 | 8/1991 | Possin et al. | 257/411 |
| 5,051,794 | 9/1991 | Mori | 257/324 |
| 5,079,605 | 1/1992 | Blake | 257/347 |
| 5,097,311 | 3/1992 | Iwase et al. | 257/412 |
| 5,146,301 | 9/1992 | Yamamura et al. | |
| 5,177,577 | 1/1993 | Taniguchi et al. | 257/59 |
| 5,225,356 | 7/1993 | Omura et al. | 257/347 |
| 5,237,188 | 8/1993 | Iwai et al. | 257/411 |
| 5,240,868 | 8/1993 | Bae et al. | 437/40 TFI |
| 5,272,361 | 12/1993 | Yamazaki | 257/66 |
| 5,289,030 | 2/1994 | Yamazaki et al. | 257/412 |
| 5,328,861 | 7/1994 | Miyakawa | 438/149 |
| 5,412,493 | 5/1995 | Kunii et al. | 257/72 |
| 5,422,293 | 6/1995 | Konya | 437/50 |
| 5,424,230 | 6/1995 | Wakai | 437/40 |
| 5,583,366 | 12/1996 | Nakazawa | 257/72 |

FOREIGN PATENT DOCUMENTS

| | | |
|---|---|---|
| 62-214669 | 9/1987 | Japan . |
| 63-9978 | 1/1988 | Japan . |
| 63-70832 | 3/1988 | Japan . |
| 63-178560 | 7/1988 | Japan . |
| 1-274117 | 11/1989 | Japan . |
| 2-159730 | 6/1990 | Japan . |
| 2-210420 | 8/1990 | Japan . |
| 2-216129 | 8/1990 | Japan . |
| 2-228042 | 9/1990 | Japan . |
| 3-165575 | 7/1991 | Japan . |
| 3-217059 | 9/1991 | Japan . |
| 4-299864 | 10/1992 | Japan . |
| 4-360580 | 12/1992 | Japan . |

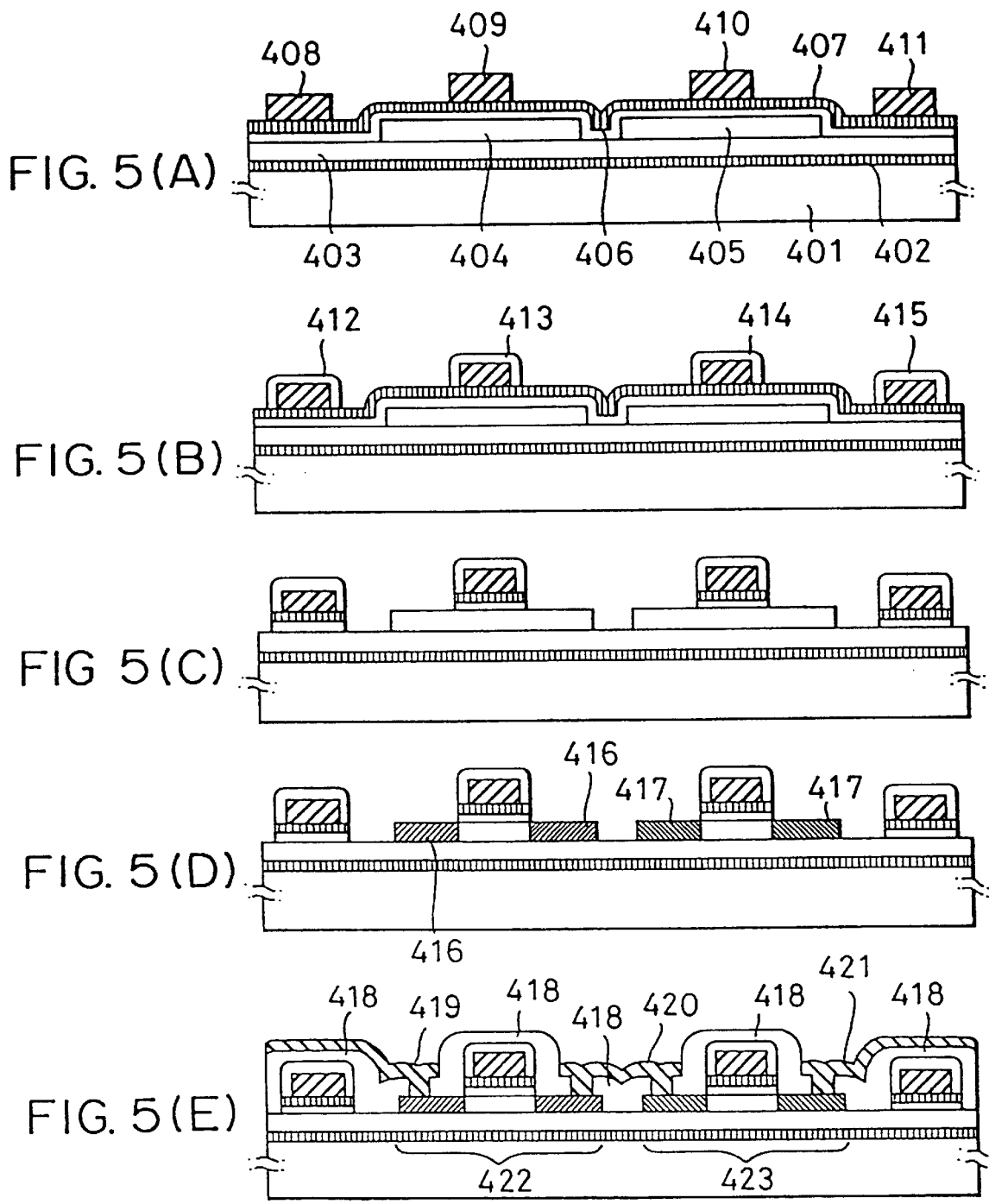

INSULATED GATE FIELD EFFECT TRANSISTOR HAVING SPECIFIC DIELECTRIC STRUCTURES

This is a divisional application of Ser. No. 08/460,560, filed Jun. 2, 1995 now abandoned, which is a divisional application of Ser. No. 08/037,162 filed Mar. 25, 1993 now U.S. Pat. No. 5,468,987, which is a continuation-in-part of Ser. No. 07/846,164 filed Mar. 5, 1992 now U.S. Pat. No. 5,289,030.

BACKGROUND OF THE INVENTION

1. Field of the Invention

This invention relates to an insulated gate type semiconductor device, and particularly to the improvement of the structure of a thin-film insulated gate field effect transistor (TFT) and a method for producing the same.

2. Description of Related Arts

Recently, a thin-film insulated gate field effect transistor (TFT) has been extensively studied. For example, in Japanese Patent Application No. 3-237100 or No. 3-238713 which has been invented by this inventor, et.al., are disclosed a TFT and a method of producing the same in which a gate electrode formed of aluminum is coated therearound with aluminum oxide which is formed by an anodic oxidation method, and a source/drain region is recrystallized by a laser annealing treatment.

The TFT thus formed has been proved to have a more excellent characteristic in comparison with a conventional silicon gate TFT or a TFT having a gate electrode which is formed of metal having high melting point such as tantalum or chrome. However, this excellent characteristic has been unobtainable with high reproducibility.

In addition, in Japanese Patent Application No. 4-30220 or No. 4-38637 which is invented by the inventor, et.al, is disclosed another type TFT and a method for producing the TFT in which a gate electrode formed of aluminum, titanium, chrome, tantalum or silicon is coated therearound with aluminum oxide formed by the anodic oxidation method so that the source/drain is not overlapped with the gate electrode, that is, these elements are formed in an offset state, and the source/drain region is recrystallized by the laser annealing treatment.

The TFT thus formed is also proved to have a more excellent characteristic in comparison with a conventional silicon gate TFT having no offset or a TFT which is provided with a gate electrode formed of metal having high melting point such as tantalum or chrome and is activated by a heat annealing treatment. However, this excellent characteristic has been also unobtainable with high reproducibility. One cause of the low reproducibility resides in the invasion (contamination) of movable ions such as natrium, etc. from the external. The reproducibility is deteriorated by the invasion of natrium from the external, particularly in a process of forming a gate electrode of metal material such as aluminum or the like (using a sputtering method or a electron beam deposition method), and in a subsequent anodic oxidation process. Particularly in the sputtering method, the risk of the invasion (contamination) of natrium ions is large. However, the sputtering method has higher producibility than the electron beam deposition method, and thus its use has been necessarily desirable to reduce a manufacturing cost.

It has been known that natrium is blocked by phosphosilicate glass and also gettered thereby. Therefore, a gate insulating film has been generally formed of phosphosilicate glass. However, it is difficult to form the phosphosilicate glass at a low temperature which is aimed by the inventions as disclosed in the above Patent Applications. In addition, if the formation of the phosphosilicate glass at such a low temperature is attempted, for example by injecting phosphorus into a silicon oxide gate insulating film using an ion doping method, there frequently occurs a problem that a large number of defects occur in the gate insulating film and thus the characteristic of the TFT is rather deteriorated.

In addition, high voltage of 100 to 300 V is required for the anodic oxidation, and thus there is a risk that the gate insulating film is damaged by the high voltage. That is, in the technical scope of the inventions as described above, the gate insulating film is formed on a semiconductor film, and the gate electrode exists on the gate insulating film. In this construction, a voltage occurs between the positively-charged gate electrode and the semiconductor film in a floating state in the anodic oxidation process. Therefore, as the resistance between the gate electrode and an electrolyte is increased in accordance with increase of the thickness of an anodic oxidation film on the gate electrode, the amount of current passing from the gate electrode through the gate insulating film and the semiconductor film to the electrolyte is increased. Accordingly, there occurs a case where the gate electrode is damaged by this current.

Further, in the inventions as described above, aluminum oxide is formed around a gate wiring. The aluminum oxide serves to improve insulation from a wiring layer thereon, and protect the gate electrode in a laser annealing treatment. However, it is difficult to form a contact hole in the aluminum oxide. In addition, when aluminum oxide is etched by a wet etching method which is excellent in producibility, an etchant forcedly etches silicon oxide which is used as an interlayer insulator, and the etching rate of silicon oxide is higher than aluminum oxide. Therefore, a vapor etching method such as a reactive ion etching method is necessarily required to be used.

The TFT is mainly classified into an inverse-stagger type which is well used for an amorphous silicon TFT and a planar type which is well used for a polycrystal silicon TFT. The latter type can have large mobility, so that it is expected to be available for a wide use. Such a TFT is mainly used for a large-area circuit which has not been covered by a conventional monocrystal IC. The conventional planar type of TFT has the same construction as the conventional monocrystal IC as shown in FIG. 12.

As is apparent from FIG. 12, the planar type of TFT is so designed as to be very flat over its whole body. This structure is very favorable for a case where it is used as an active element for a liquid crystal display device. This is because in the liquid crystal display device, the thickness of a liquid crystal layer is about 5 to 6 $\mu$m, and it is required to control the thickness with accuracy of $\pm 0.1$ $\mu$m as a whole. Therefore, an element structure having high unevenness (a large number of recesses and projections) causes ununiformity of electric field, so that not only the characteristic of the element is deteriorated, but also the element itself suffers a mechanical damage.

The element structure as shown in FIG. 12 is a general one for the planar type of TFT. The structure and the method for producing the TFT will be briefly described.

A silicon oxide layer 902 serving as a sealer is formed on an insulating substrate 901 such as a glass substrate, and a semiconductor region 903 is formed on the silicon oxide layer 902. Further, a gate insulating film 904 is formed, and then a wiring 905 and a gate electrode 906 are formed of a first metal wiring layer.

Thereafter, an impurity region is formed in the semiconductor region in self-alignment, an interlayer insulator 907 is formed, and then a hole for electrode formation (contact hole) is formed. Subsequently, metal wirings 908 and 909 are formed of a second metal wiring layer. If the TFT is used for a liquid crystal display device, a pixel electrode 910 is formed of transparent conductive material.

As described above, the planar type of TFT having the structure as shown in FIG. 12 is characterized in that unevenness of the structure is low, however, has several problems. The maximum significant problem resides in that a hole is formed in an electrode, and thus unevenness becomes higher at the contact hole portion, so that disconnection or contact failure occurs at the portion. Particularly, an unit part of a large-area circuit in which a TFT is used, has an area of at least 10 times as large as a conventional monocrystal IC, so that it is very difficult to depress the disconnection or contact failure over the whole area. In order to avoid this problem, the contact hole is required to be widened. However, the increase of the size of the contact hole causes enlargement of the element area, and causes reduction in aperture ratio for a liquid crystal display device, for example.

In order to further avoid this problem, a structure as shown in FIG. 11 in which the concept of "contact hole" is dismissed and the unevenness at the electrode portion is depressed is proposed. In this structure, there is no interlayer insulator at an electrode portion which is connected to a source/drain of a semiconductor region, and no contact hole is provided. In place of the contact hole, a metal wiring is directly formed. This structure enables the contact area of the contact to be increased, and the contact failure at the portion is greatly reduced. This is based on the fact that there is little step at the contact portion.

The structure as shown in FIG. 11 and the method of producing the structure will be briefly described.

First, a silicon oxide layer 802 serving as a sealer is formed on a substrate 801. Subsequently, a semiconductor region 803 is formed, and then a gate insulating film 804 is formed. Further, a wiring 805 and a gate electrode 806 are formed of a first metal layer, and an impurity region is formed in self-alignment using the gate electrode as a mask, thereafter, an interlayer insulator 807 being formed. The interlayer insulator 807 is not formed at the semiconductor region. For example, after the layer insulating film is formed over the whole surface, the layer insulator at the semiconductor region is removed. At this time, the gate insulating film 804 is also etched. In an extreme manner, no interlayer insulator is formed at portions other than a portion where the first and second metal layers are overlapped with each other. That is, the etching treatment is carried out in self-alignment using the gate electrode 806 and the semiconductor region 803 as a mask together with a photoresist at the portion where wirings are intersected to each other. Thereafter, wirings 808 and 809 are formed of the second metal layer, and contacted to the semiconductor region. For the liquid crystal display device, a transparent electrode 810 is further formed.

In the structure as shown in FIG. 11, there is no contact hole, and thus no contact failure occurs at this portion. However, other problems occur. One problem is that in a process of removing the interlayer insulating film, the etching extends to not only the silicon oxide film 802, but also the substrate. This is liable to occur when the etching process is carried out using the wet etching method providing high producibility. The temperature distribution of the substrate of a large-area substrate is ununiform, and the etching rate of an usual etchant is greatly varied in accordance with minute difference of temperature, so that an over-etched portion occurs when the etching treatment is continued until the etching is completely conducted on the whole portion.

On the other hand, in a dry etching treatment such as a reactive ion etching (RIE), the uniformity of plasma distribution greatly affects the etching rate, and it is difficult to assure uniformity of etching over the whole area of the substrate. Therefore, the larger the area is, the more critical the over-etching problem becomes. For example, as shown in FIG. 11, there occurs a case where the substrate is etched in depth of d due to an over-etch. This structure has a larger step than the structure as shown in FIG. 12, and thus it is unsuitable not only for the liquid crystal display device, but also for other applications such as a driving circuit for an image sensor, etc.

In addition, even on the same substrate, no over-etch occurs at suitably-etched portions, and thus these portions are not etched as shown above. Therefore, the etching depth is varied with a position on the surface of the substrate, so that a moderate unevenness occurs on the surface of the substrate. This unevenness on the surface of the substrate causes a critical problem for application to the liquid crystal display device.

The over-etching problem is not limited to the above problem. In general, a semiconductor element is formed under an extremely pure atmosphere, and foreign elements such as natrium, etc. are extremely excluded. However, foreign elements are necessarily contaminated in the substrate although contamination amount is varied, and in order to prevent diffusion of the foreign elements in the TFT, these elements are blocked by the silicon oxide film layer serving as a sealer.

However, the above blocking effect of the silicon oxide layer would be lost if the substrate is exposed due to the over-etch as shown in FIG. 11, and thus the foreign elements are diffused through the substrate. The foreign elements contaminate an etching tank for the wet etching treatment, or an etching chamber for the dry etching treatment, for example. Therefore, if the contaminated state is left as it is, the contamination would extend to not only a product concerned, but also other products to be subsequently manufactured. Much labor and long time are required for a cleaning process for removing the foreign elements, and such a special process economically deteriorates this method.

SUMMARY OF THE INVENTION

An object of this invention is to provide an insulating gate type of semiconductor device (an insulated gate field effect transistor) and a producing method therefor in which an over-etching phenomenon is depressed to prohibit the diffusion of foreign elements from a substrate and flatness of the device is further improved.

Another object of this invention is to provide the structure of a TFT and a producing method therefore in which invasion of movable ions from an external is prevented, and a contact with aluminum wirings coated with an anodic oxide film is facilitated, and in which breakdown of a gate insulating film is prevented to improve reliability of a device.

In order to attain the above objects, an insulated gate field effect transistor (an insulating gate type of semiconductor device) according to this invention comprises at least a semiconductor layer provided on an insulating substrate, an insulating film layer provided on the semiconductor layer and a gate electrode provided on the insulating layer and comprising aluminum, chromium, titanium, tantalum, silicon, aluminum having added thereto silicon at 0.5 to 3%, an alloy thereof, or a multi-layer thereof, wherein the insulating film layer comprises an aluminum oxide monolayer, a silicon oxide monolayer, a silicon nitride monolayer, a two-layer of an aluminum oxide layer and a silicon nitride layer, a two-layer of an aluminum oxide layer and a silicon oxide layer, a two-layer of a silicon nitride layer and a silicon oxide layer, a two-layer of a phosphosilicate glass layer and a silicon oxide layer, or a three-layer of an aluminum oxide layer, a silicon oxide layer and a silicon nitride layer.

A producing method for the insulating gate type of semiconductor device according to this invention comprising the steps of forming a semiconductor region on an insulating substrate, forming on the semiconductor region an insulating film layer comprising an aluminum oxide monolayer, a silicon oxide monolayer, a silicon nitride monolayer, a two-layer of an aluminum oxide layer and a silicon nitride layer, a two-layer of an aluminum oxide layer and a silicon oxide layer, a two-layer of a silicon nitride layer and a silicon oxide layer, a two-layer of a phosphosilicate glass layer and a silicon oxide layer, or a three-layer of an aluminum oxide layer, a silicon oxide layer and a silicon nitride layer, forming on the insulating film layer a metal film (conductor film) mainly formed of aluminum, chromium, tantalum, titanium, silicon, aluminum having added thereto silicon at 0.5 to 3%, an alloy thereof, or a multi-layer thereof, and supplying current to the metal film (conductor film) in an electrolyte to form an oxide layer on the metal film. A current is made to flow through the conductor film in the electrolyte by the supplying step to form a film comprising an oxide of the material of the conductor film on a surface of the conductor film.

According to one aspect of this invention, a silicon nitride film is interposed between an aluminum gate electrode and a gate insulating film. Assuming the composition ratio of silicon in the silicon nitride film to 1, the composition ratio of nitrogen is in a range of 1 to 4/3, preferably in a range of 1.2 to 4/3, and more preferably in a range of 1.25 to 4/3. In addition to nitrogen and silicon, hydrogen or oxygen may be added.

The silicon nitride film serves to block movable ions such as natrium, etc., and thus prevent the movable ions from invading from the gate electrode and other portions into a channel region. In addition, silicon nitride has higher conductivity than silicon oxide which is usually used for the gate insulating film, and thus the silicon nitride film also serves to prevent an excessive voltage from being applied between the gate electrode and the semiconductor region (channel region) beneath the gate electrode, so that breakdown of the gate insulating film is prevented.

Accordingly, the semiconductor region and the gate insulating film are formed, then the silicon nitride film is formed, and then an aluminum electrode is formed to form the gate electrode. The silicon nitride film is also preferable because when the silicon nitride film exists integrally over the whole surface of the substrate during the anodic oxidation of the aluminum electrode, the positive potential is kept to a substantially constant potential over the whole surface of the substrate.

According to another aspect of this invention, in the gate electrode and the wiring extending thereto whose surfaces will be subjected to the anodic oxidation in a subsequent process, a portion thereof which requires contact formation is covered by material which is different from aluminum and has a mask action against the anodic oxidation. As the material is suitably used chrome, gold, titanium, silicon, indium oxide, titanium oxide, indium-titanium oxide, zinc oxide or the like.

At the portion covered by the above material, only the following two cases will occur in the anodic oxidation. That is, an oxide is formed on the surface of the portion, or no new oxide is formed on the surface of the portion. For example, if chrome or titanium is used, the former case will occur. On the other hand, if gold, titanium oxide, indium oxide or the like is used, the latter case will occur.

After the anodic oxidation, only the above material is selectively etched to expose the surface of metal aluminum of the gate wiring. Therefore, a contact hole is easily formed. Further, this invention is also favorable for the anodic oxidation. That is, in the anodic oxidation, all gate electrodes and wirings are required to be connected to one another, and kept to a positive potential. However, when those elements are practically used in a circuit, the circuit never functions if all the gate electrodes and wirings are integrally formed (integrally connected). Therefore, it is necessary that the wirings are cut or broken if occasion demands, and then the wirings are connected to one another again. This technique is typically disclosed in Japanese Patent Application No. 3-348130 which is invented by the inventor of this application, et.al.

In this technique, the following three photolithographic processes are required: (1) formation of gate wirings, (2) patterning of the gate wirings after anodic oxidation, and (3) re-connection of the gate wirings. Particularly in the process (3), the etching of aluminum oxide is difficult as described above, and thus formation of a contact hole is difficult.

However, according to this invention, the above requirement is satisfied by the following three photolithographic processes: (1) formation of gate wirings, (2) formation of wirings for anodic oxidation, and (3) re-connection of the gate wirings. The wirings for anodic oxidation are ones which are used only to supply current for anodic oxidation to a gate electrode for each TFT. These wirings are formed of the material as described above, and thus the etching thereof can be selectively carried out, so that the photolithographic process is unnecessary. In addition, after the wirings for anodic oxidation are removed, the surfaces of the gate wirings are exposed, and thus it is easily carried out to form on the surfaces wirings through which the gate wirings are connected to one another.

According to another aspect of this invention, an aluminum oxide or silicon nitride layer is provided as an etching stopper layer on the substrate to prevent the over-etching. The aluminum oxide or silicon nitride layer may be provided between the substrate and the silicon oxide layer serving as the sealer on the substrate, or between the gate oxide film and the gate electrode. In this case, the interlayer insulator is etched before the electrode of the TFT is formed, however, the etching is stopped at the aluminum oxide or silicon nitride layer. That is, according to this invention, the etching can be uniformly carried out over the whole portion of the substrate. Of course, the possibility of occurrence of the contact failure, etc. is lowered because no contact hole exists. This will be described with reference to FIG. 10.

FIG. 10 shows a typical embodiment of this invention. In this embodiment, the aluminum oxide or silicon nitride film of this invention is formed between the gate insulating film and the gate electrode. In this case, the relationship in composition ratio between nitrogen and silicon in silicon nitride is as follows. Assuming the composition ratio of silicon to 1, the composition ratio of nitrogen is in a range of 1 to 4/3, preferably in a range of 1.2 to 4/3, and more preferably in a range of 1.25 to 4/3. For aluminum oxide, assuming aluminum to 1, oxygen is preferably in range of 1.4 to 1.5. The aluminum oxide or silicon nitride layer is required to have such a thickness that it can endure the etching. For example, in the wet etching treatment of silicon oxide, the etching of aluminum oxide or silicon nitride can be depressed at an extremely low level, whereas in the dry etching treatment such as RIE, a suitable thickness, for example, 50 to 1000 nm thickness is required for aluminum oxide or silicon nitride because a selection ratio of aluminum oxide or silicon nitride is not negligible. However, in the case where the aluminum oxide or silicon nitride layer is disposed between the gate electrode and the gate insulating film as shown in FIG. 10, an excessively thick aluminum oxide or silicon nitride layer obstructs the operation of the TFT, and thus the thickness of the aluminum oxide or silicon nitride layer is set to a suitable one, for example, 2 to 50 nm.

The structure of the TFT as shown in FIG. 10 and the producing method therefore will be briefly described.

A reference numeral 701 represents a substrate, and a reference numeral 702 represents a silicon nitride layer (first silicon nitride layer) which is formed to prevent diffusion or foreign elements of the substrate into the TFT. A reference numeral 703 represents a silicon oxide layer serving as a sealer for preventing back-leak of the TFT. A reference numeral 704 represents a semiconductor region, and after the formation of the semiconductor region 704, a gate insulating film 705 and the aluminum oxide or silicon nitride layer (second aluminum oxide or silicon nitride layer) are formed. Thereafter, a wiring 707 and a gate electrode 708 are formed of a first metal layer. In this embodiment, an oxide is formed by the anodic oxidation method around the wiring and the electrode to strengthen insulating and heat-resistance properties. However, like the prior art, the formation of the oxide may be eliminated. Subsequently, an impurity region is formed in the semiconductor region 704 in self-alignment.

Thereafter, an interlayer insulator 709 is formed at only a portion where second wirings are intersected. In this case, when the interlayer insulator is formed of silicon oxide, the etching proceeds to the silicon nitride layer 706, but stopped thereat, so that a flat structure is obtained. Subsequently, only the aluminum oxide or silicon nitride layer at the semiconductor region 704 and the gate oxide film (silicon oxide) beneath the aluminum oxide or silicon nitride layer are etched, so that the surface of the semiconductor region is exposed. At this time, the gate electrode is required not to be etched. Even for the aluminum electrode, sufficient corrosion resistance can be obtained when an anodic oxidation film is provided therearound.

Finally, metal wiring and electrode 710 and 711 are formed of a second metal layer. A transparent electrode may be formed for a liquid crystal display device. As is apparent from FIG. 10, the section of the element thus formed is designed so as to be as flat as that of FIG. 12.

An insulated gate field effect transistor in accordance with the present invention comprises:

source and drain regions provided on a substrate;

a conductor connected with one of said source and drain regions and provided on said substrate; and a film provided on said substrate and in contact with said conductor and comprising a material selected from the group consisting of silicon nitride and aluminum oxide.

The conductor may comprise a metal wiring or a pixel electrode of an electro-optical device. Ratio of nitrogen to silicon in the silicon nitride film is preferably 1 to 4/3. Also, ratio of oxygen to aluminum in the aluminum oxide film is preferably 1.4 to 1.5.

BRIEF DESCRIPTION OF THE DRAWINGS

FIG. 5 shows a process for producing a semiconductor device (cross-sectional view) according to this invention;

DETAILED DESCRIPTION OF PREFERRED EMBODIMENTS

Preferred embodiments according to this invention will be described with reference to the accompanying drawings.

[Embodiment 1]

Figure 1:
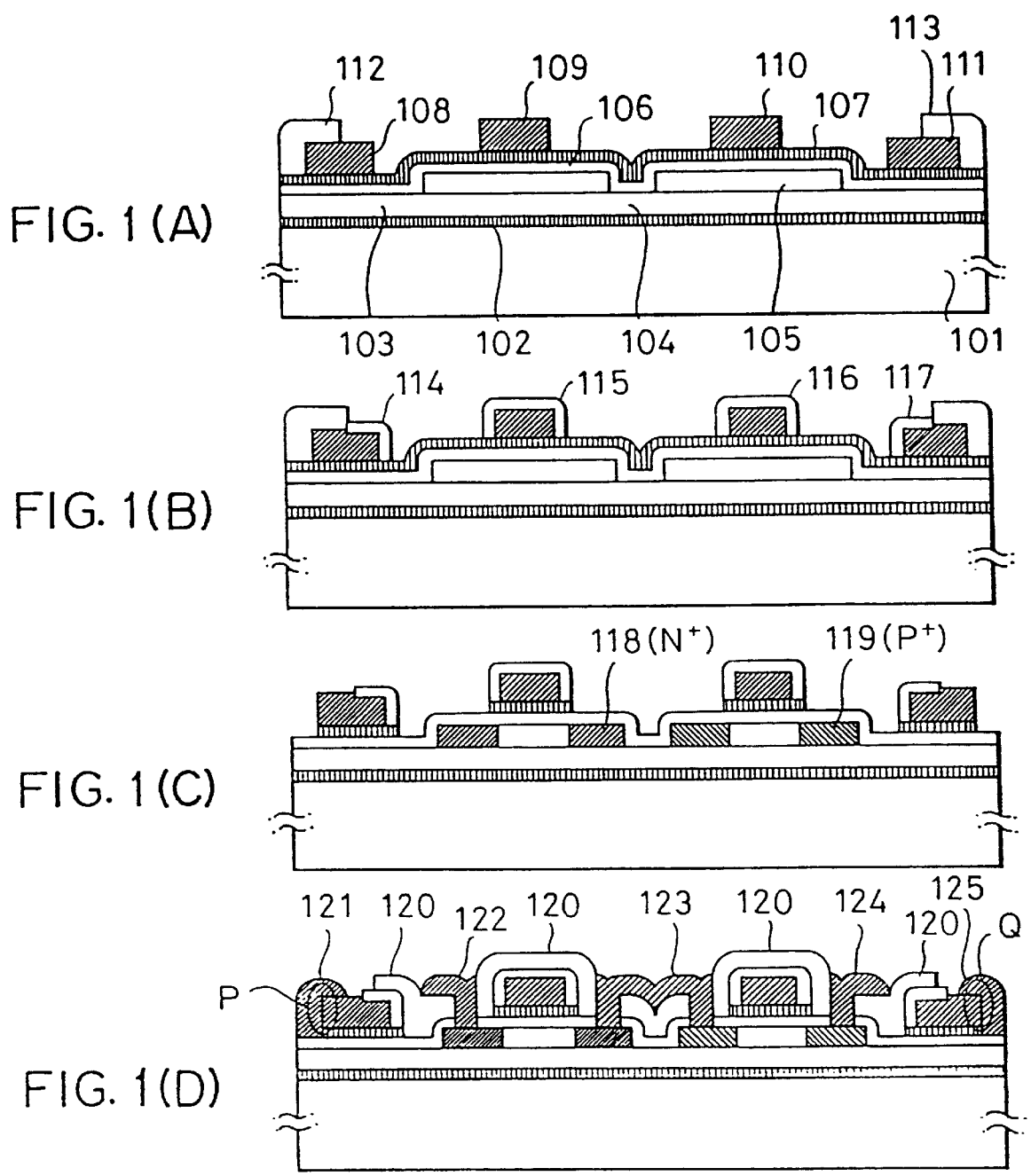
FIG. 1 shows a process for producing a semiconductor device (cross-sectional view) according to this invention.

FIG. 1 is cross-sectional views showing a manufacturing process of an embodiment. The detailed conditions of this embodiment are substantially identical to those of Japanese Patent Application No. 3-237100 which was filed by the inventor of this application, et.al, and the description thereof is not particularly made.

An N—O glass produced by Nippon Electric Glass Co., Ltd. was used as a substrate 101. This glass has high strain temperature, but contains a large amount of lithium and natrium. Therefore, in order to prevent invasion of these movable ions from the substrate, a silicon nitride film 102 was formed in thickness of 10 to 50 nm on the substrate by a plasma CVD method or a low pressure CVD method. Further, a silicon oxide film serving as a sealer was formed in thickness of 100 to 800 nm by a sputtering method. An amorphous silicon film was formed on the silicon oxide film in thickness of 20 to 100 nm by the plasma CVD method, and annealed at 600° C. for 12 to 72 hours at nitrogen atmosphere to crystallize the amorphous silicon film. Subsequently, this result was subjected to a patterning process by the photolithography and the reactive ion etching (RIE) method, thereby forming islandish semiconductor regions 104 (for N-channel TFT) and 105 (for P-channel TFT) as shown in FIG. 1(A).

Subsequently, a gate oxide film 106 was deposited in thickness of 50 to 200 nm by a sputtering method using silicon oxide as a target under oxygen atmosphere, and then a silicon nitride film 107 was deposited in thickness of 2 to 20 nm, preferably in thickness of 8 to 11 nm by the plasma CVD method or the low pressure CVD method.

Thereafter, an aluminum film was formed by the sputtering method or the electron beam deposition method, and then subjected to a patterning process with mixed acid (phosphoric acid solution added with 5% nitric acid) to form gate electrode/wirings 108 to 111. Through this process, an outline of the TFT was shaped. Subsequently, a chrome film was formed in thickness of 100 to 300 nm on the above result by the sputtering method, and subjected to the patterning process as shown in FIG. 1(A) to form chrome regions 112 and 113.

Further, current was supplied to the gate electrode/wirings 108 to 111 in the electrolyte to form aluminum oxide films 114 to 111 by the anodic oxidation method. At this time, no aluminum oxide was formed on the portion coated by chrome. An anodic oxidation condition as disclosed in Japanese Patent Application No. 3-237100 which was invented by the inventor of this application, et.al was adopted in this embodiment. FIG. 1(B) shows an intermediate produced in the above processes.

Subsequently, the chrome regions 112 and 113 were etched, and then the silicon nitride 107 at portions other than the portions beneath the gate electrode/wirings were removed by the reactive ion etching method. Thereafter, an N-type impurity and a P-type impurity were injected into the semiconductor region 104 and the semiconductor region 105 respectively by a well-known ion injection method, thereby forming an N-type impurity region (source, drain) 118 and a P-type impurity region 119. This process was carried out using a well-known CMOS technique.

Through these processes, the structure as shown in FIG. 1(C) was obtained. Naturally, the portion doped with the impurity by the ion injection method had low crystallinity, and thus it was substantially in a non-crystal state (amorphous state, or a polycrystal state close to the amorphous state). Therefore, a laser anneal treatment was conducted to restore crystallinity at the portion. This process may be carried out by a heat annealing treatment at 600 to 850° C. The same laser annealing condition as disclosed in Japanese Patent Application No. 3-237100 for example was adopted.

Through the manner as described above, the outline of the element was shaped. Afterwards, similarly in the ordinary manner, the interlayer insulator 120 was formed by the sputtering method for silicon oxide film formation, and a hole for electrode was formed by a well-known photolithography to expose the surface of the semiconductor region or the gate electrode/wiring. Finally, a metal film (aluminum or chrome) was selectively formed to form electrode/wirings 121 to 125. The first metal wirings 108 and 111 were connected to the second metal wirings 121 and 125 at points P and Q, respectively.

[Embodiment 2]

Figure 2:
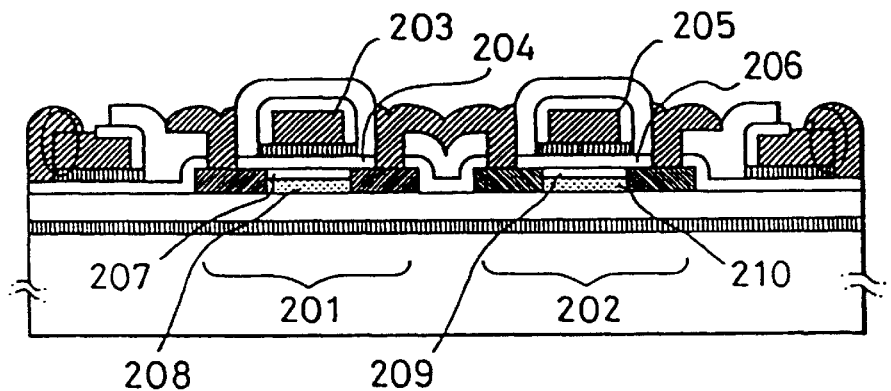
FIG. 2 shows an example of the structure of a semiconductor device according to this invention.

FIG. 2 shows an embodiment in which this invention was applied to a TFT having two-layered channel which was invented by the inventor of this application, et.al., and described in applications filed on Feb. 25, 1992 entitled "THIN FILM INSULATING GATE TYPE OF SEMICONDUCTOR DEVICE AND A PRODUCING METHOD THEREFOR" (applicant: Semiconductor Energy Laboratory Co., Ltd, docketing numbers: P002042-01 to P002044-03).

That is, in FIG. 2, a reference numeral 201 represents an N-channel TFT, a reference numeral 202 represents a P-channel TFT, and first layers 208 and 210 at these channel regions were substantially formed of amorphous silicon. The thickness thereof was set to 20 to 200 nm.

Reference numerals 207 and 209 represent silicon in a substantially polycrystal or semi-amorphous state, and the thickness thereof was set to 20 to 200 nm. Reference numerals 204 and 206 represent gate insulating films formed of silicon oxide, and the thickness thereof was set to 50 to 300 nm. Reference numerals 203 and 205 represent silicon nitride films each having thickness of 2 to 20 nm which was formed in the same manner as the Embodiment 1. The construction of these elements were formed on the basis of the disclosure of the Patent Application as described above, or the description for the Embodiment 1.

[Embodiment 3]

FIG. 3 shows a process for performing an anodic oxidation and then wiring using this invention. First, plural islandish semiconductor regions 302 were formed like the Embodiment 1, and a gate insulating film and a silicon nitride film of this invention (if occasion demands) were formed. Thereafter, aluminum gate electrode/wirings 303 were formed as a first conductor layer by patterning (FIG. 3(A)).

Subsequently, a wiring 304 for positive-electrode wiring was formed of chromium as a second conductor layer in contact with the gate electrode/wirings. The same condition for the chrome film as the Embodiment 1 was adopted (FIG. 3(B)).

Under the same condition as the Embodiment 1, the chrome wiring 304 was subjected to the anodic oxidation while kept to a positive potential, and an anodic oxide film 305 was formed on the surface of each gate electrode/wiring by making a current flow through the first conductor layer and the second conductor layer in an electrolyte. The oxide film 305 comprise an oxide of the material of the first conductor layer. (FIG. 3(C)).

Figure 3A:
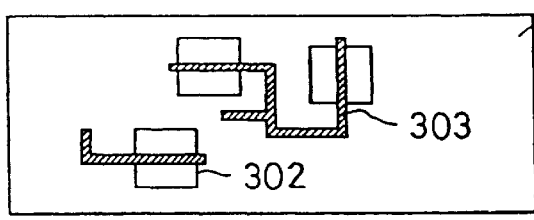
FIG. 3 shows a process for producing a semiconductor device (plan view) according to this invention.
Figure 3B:
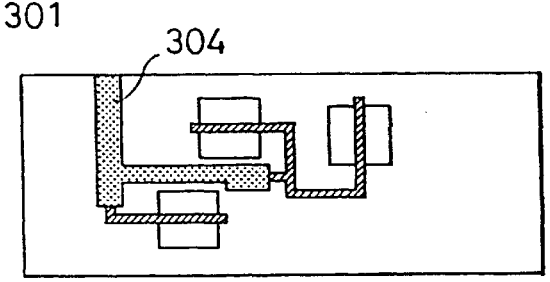
Figure 3C:
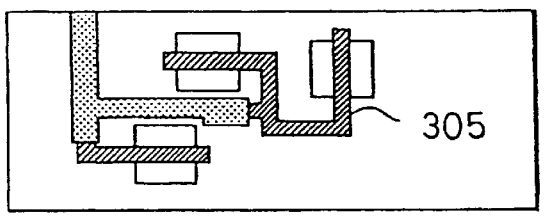
Figure 3D:
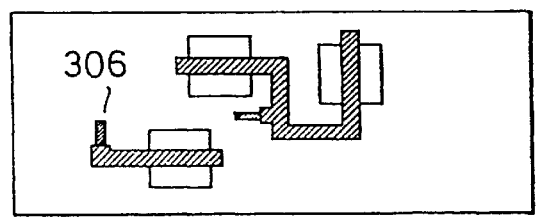
Figure 3E:
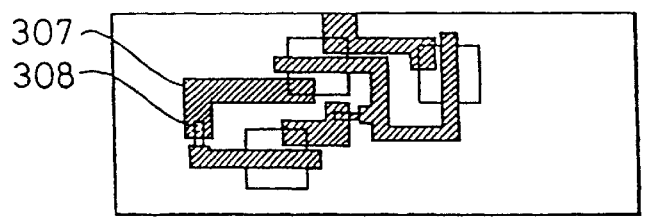

Subsequently, under the same condition as the Embodiment 1, the chrome wiring was removed to form a first contact hole in the oxide film 305 and expose the surface 306 of the gate wirings (FIG. 3(D)).

Next, the impurity doping, the formation of an interlayer insulator and formation of a contact hole were performed in the same manner as the Embodiment 1 (that is, an insulating layer (an interlayer insulating layer) was formed on the oxide film 305 and a second contact hole was formed in this insulating layer by selectively etching the insulating layer, and then a second metal wiring 307 was formed of aluminum as a third conductor layer. At this time, the second metal wiring 307 was connected with the gate wiring (the first conductor layer) at the position 308 of FIG. 3 (FIG. 3(E)) through a contact which comprises the first contact hole and the second contact hole. The gate electrode/wirings 303 may comprise tantalum instead of aluminum. The second conductor layer comprises a material different from that of the gate electrode/wirings 303 in any case. For example, the second conductor layer comprises chromium, gold, titanium, silicon, indium oxide, titanium oxide or zinc oxide.

[Embodiment 4]

FIG. 4 is cross-sectional views showing a manufacturing process of this embodiment. The detailed conditions of this embodiment are substantially identical to those of Japanese Patent Application No. 4-30220 or No. 4-38637, and thus the description thereof is eliminated.

Figure 4A:
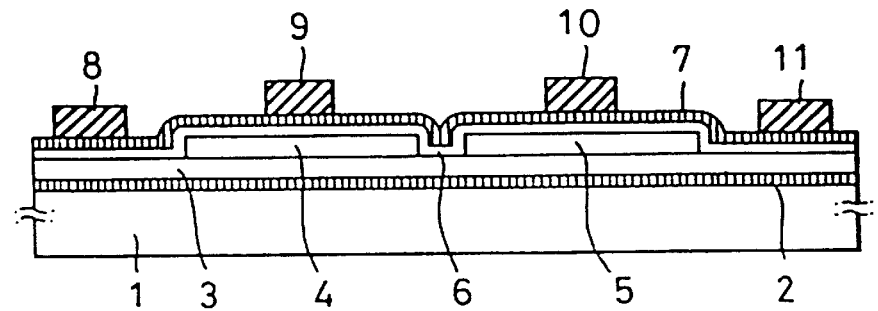
FIG. 4 shows a process for producing a semiconductor device (cross-sectional view) according to this invention.

An N—O glass produced by Nippon Electric Glass Co., Ltd. was used as a substrate 1. This glass has high strain temperature, but contains a large amount of lithium and natrium. Therefore, in order to prevent invasion of these movable ions from the substrate, a silicon nitride film 2 was formed in thickness of 10 to 50 nm on the substrate by a plasma CVD method or a low pressure CVD method. Further, a silicon oxide film serving as a sealer was formed in thickness of 100 to 800 nm by a sputtering method. An amorphous silicon film was formed on the silicon oxide film in thickness of 20 to 100 nm by the plasma CVD method, and annealed at 600° C. for 12 to 72 hours at nitrogen atmosphere to crystallize the amorphous silicon film. Subsequently, this result was subjected to a patterning process by the photolithography and the reactive ion etching (RIE) method, thereby forming islandish semiconductor regions 4 (for N-channel TFT) and 105 (for P-channel TFT) as shown in FIG. 4(A).

Subsequently, a gate oxide film 106 was deposited in thickness of 50 to 200 nm by a sputtering method using silicon oxide as a target under oxygen atmosphere, and then a silicon nitride film 7 was deposited in thickness of 2 to 20 nm, preferably in thickness of 8 to 11 nm by the plasma CVD method or the low pressure CVD method.

Thereafter, an aluminum film was formed by the sputtering method or the electron beam deposition method, and then subjected to a patterning process with mixed acid (phosphoric acid solution added with 5% nitric acid) to form gate electrode/wirings 8 to 11. Through this process, an outline of the TFT was shaped.

Figure 4B:
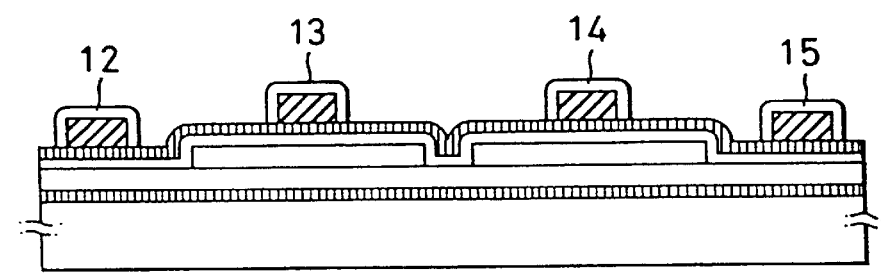
Figure 4C:
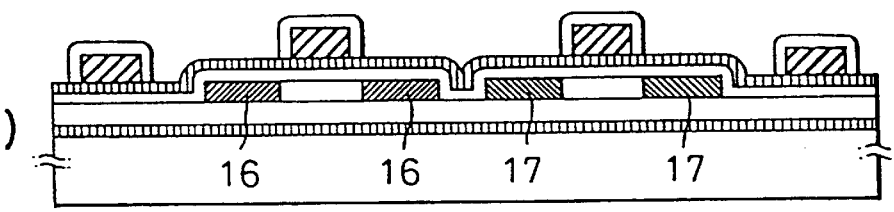

Further, current was supplied to the gate electrode/wirings 8 to 11 in the electrolyte to form aluminum oxide films 12 to 15 by the anodic oxidation method. An anodic oxidation condition as disclosed in Japanese Patent Application No. 4-30220 which was invented by the inventor of this application, et.al was adopted in this embodiment. FIG. 4(B) shows an intermediate produced in the above processes.

Thereafter, an N-type impurity and a P-type impurity were injected into the semiconductor region 4 and the semiconductor region 5 respectively by a well-known ion injection method, thereby forming an N-type impurity region (source, drain) 16 and a P-type impurity region 17. This process was carried out using a well-known CMOS technique.

Silicon nitride at portions other than the portions beneath the gate electrode/wirings were removed by the reactive ion etching method. This process may be replaced by the wet etching treatment. In this case, by utilizing the difference in etching rate between aluminum oxide serving as the anodic oxide film and silicon nitride, the etching treatment is carried out in self-alignment using aluminum oxide as a mask.

Figure 4D:
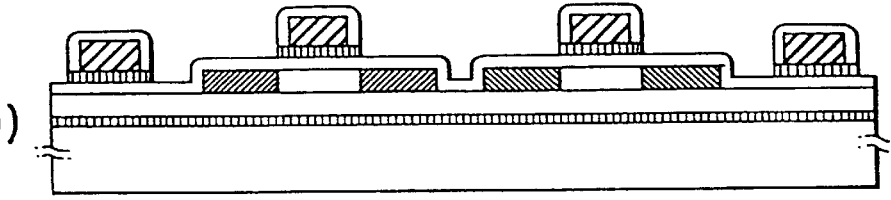
Figure 4E:
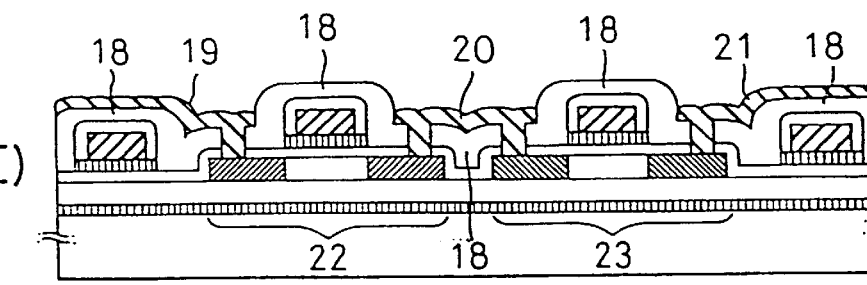

Through these processes, the structure as shown in FIG. 4(D) was obtained. Naturally, the portion doped with the impurity by the ion injection method had low crystallinity, and thus it was substantially in a non-crystal state (amorphous state, or a polycrystal state close to the amorphous state). Therefore, a laser anneal treatment was conducted to restore crystallinity at the portion. This process may be carried out by a heat annealing treatment at 600 to 850° C. The same laser annealing condition as disclosed in Japanese Patent Application No. 4-30220 for example was adopted. After the laser annealing treatment, the annealing treatment was carried out for 30 minutes to 3 hours at 250 to 450° C. under hydrogen atmosphere (1 to 700 torr, preferably 500 to 700 torr), to thereby add hydrogen to the semiconductor region and depress lattice defects (dangling bond, etc.).

Through the manner as described above, the outline of the element was shaped. Afterwards, similarly in the ordinary manner, the interlayer insulator 18 was formed by the sputtering method for silicon oxide film formation, and a hole for electrode was formed by a well-known photolithography to expose the surface of the semiconductor region or the gate electrode/wiring. Finally, a metal film (aluminum or chrome) was selectively formed to form electrode/wirings 19 to 21. Here, the second metal wirings 19 and 21 were transverse over the first metal wirings 8 and 11. Through these processes, NTFT 22 and PTFT 23 were formed.

[Embodiment 5]

FIG. 5 is cross-sectional views showing a manufacturing process of this embodiment. The detailed conditions of this embodiment are substantially identical to those of Japanese Patent Application No. 4-30220, and thus the description thereof is eliminated.

An N—O glass produced by Nippon Electric Glass Co., Ltd. was used as a substrate 401. A silicon nitride film 402 was formed in thickness of 10 to 50 nm on the substrate by a plasma CVD method or a low pressure CVD method. Further, a silicon oxide film 403 serving as a sealer was formed in thickness of 100 to 800 nm by a sputtering method. An amorphous silicon film was formed on the silicon oxide film in thickness of 20 to 100 nm by the plasma CVD method, and annealed at 600° C. for 12 to 72 hours at nitrogen atmosphere to crystallize the amorphous silicon film. Subsequently, this result was subjected to a patterning process to form islandish semiconductor regions 404 (for N-channel TFT) and 405 (for P-channel TFT) as shown in FIG. 5(A).

Subsequently, a gate oxide film 406 was deposited in thickness of 50 to 200 nm by a sputtering method, and then a silicon nitride film 407 was deposited in thickness of 2 to 20 nm, preferably in thickness of 8 to 11 nm by the plasma CVD method or the low pressure CVD method.

Thereafter, an aluminum film was formed by the sputtering method or the electron beam deposition method, and then subjected to a patterning process to form gate electrode/wirings 408 to 411. Through this process, an outline of the TFT was shaped as shown in FIG. 5(A).

Further, current was supplied to the gate electrode/wirings 408 to 411 in the electrolyte to form aluminum oxide films 412 to 415 by the anodic oxidation method. An anodic oxidation condition as disclosed in Japanese Patent Application No. 4-30220 which was invented by the inventor of this application, et.al was adopted in this embodiment. FIG. 5(B) shows an intermediate produced in the above processes.

Silicon nitride 407 and silicon oxide 406 at portions other than the portions beneath the gate electrode/wirings were removed by the reactive ion etching method as shown in FIG. 5(C) to expose the semiconductor regions 404 and 405. This process may be replaced by the wet etching treatment. In this case, by utilizing the difference in etching rate between aluminum oxide serving as the anodic oxide film and each of silicon nitride and silicon oxide, the etching treatment is carried out in self-alignment using aluminum oxide as a mask. Further, by the laser doping technique (Japanese Patent Application No. 3-283981) which was invented by the inventor of this application, et.al, N-type impurity and P-type impurity were doped into the semiconductor regions 404 and 405 respectively, thereby forming an N-type impurity region (source, drain) and a P-type impurity region 417. This process was carried out using the CMOS technique as described Japanese Patent Application No. 3-283981.

Through these processes, the structure as shown in FIG. 5(D) was obtained. In the laser doping technique, unlike the Embodiment 4, no laser annealing process or no heat annealing process is required because the injection of the impurities and the annealing treatment are simultaneously carried out. After the laser doping treatment, the annealing treatment was carried out for 30 minutes to 3 hours at 250 to 450° C. under hydrogen atmosphere (1 to 700 torr or 500 to 700 torr), to thereby add hydrogen to the semiconductor region and depress lattice defects (dangling bond, etc.).

Through the manner as described above, the outline or the element was shaped. Afterwards, similarly in the ordinary manner, the interlayer insulator 418 was formed by the sputtering method for silicon oxide film formation, and a hole for electrode was formed by a well-known photolithography to expose the surface of the semiconductor region or the gate electrode/wiring. Finally, a second metal film (aluminum or chrome) was selectively formed to form electrode/wirings 419 to 421. Through these processes, NTFT 422 and PTFT 423 were formed.

[Embodiment 6]

FIG. 6 is cross-sectional views showing a manufacturing process of this embodiment. The detailed conditions of this embodiment are substantially identical to those of Japanese Patent Application No. 4-30220, and thus the description thereof is eliminated.

Figure 6A:
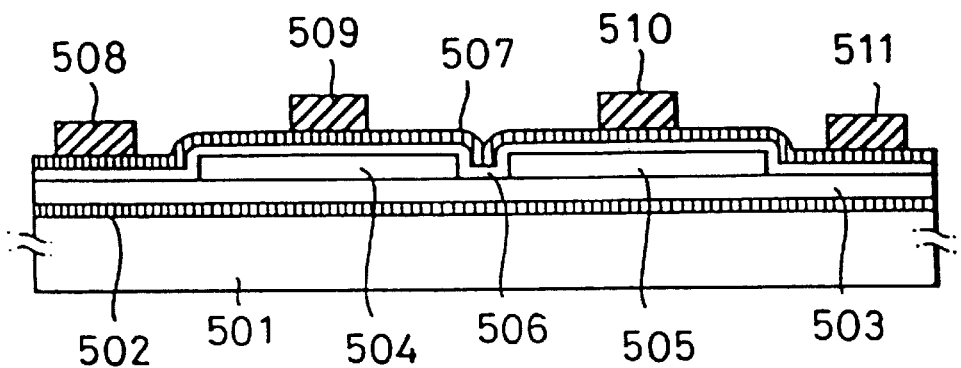
FIG. 6 shows a process for producing a semiconductor device (cross-sectional view) according to this invention.

An N—O glass produced by Nippon Electric Glass Co., Ltd. was used as a substrate 501. A silicon nitride film 502 was formed in thickness of 10 to 50 nm on the substrate by the plasma CVD method or the low pressure CVD method. Further, a silicon oxide film 503 serving as a sealer was formed in thickness of 100 to 800 nm by the sputtering method. An amorphous silicon film was formed on the silicon oxide film in thickness or 20 to 100 nm by the plasma CVD method, and annealed at 600° C. for 12 to 72 hours at nitrogen atmosphere to crystallize the amorphous silicon film. Subsequently, this result was subjected to a patterning process to form islandish semiconductor regions 504 (for N-channel TFT) and 505 (for P-channel TFT) as shown in FIG. 6(A).

Subsequently, a gate oxide film 506 was deposited in thickness of 50 to 200 nm by the sputtering method, and then a silicon nitride film 507 was deposited in thickness of 2 to 20 nm, preferably in thickness of 8 to 11 nm by the plasma CVD method or the low pressure CVD method.

Thereafter, an aluminum film was formed by the sputtering method or the electron beam deposition method, and then subjected to a patterning process to form gate electrode/wirings 508 to 511. Through this process, an outline of the TFT was shaped as shown in FIG. 6(A).

Figure 6B:
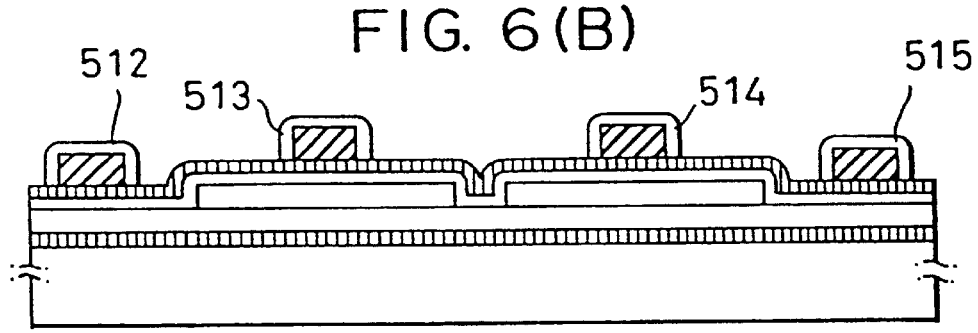
Figure 6C:
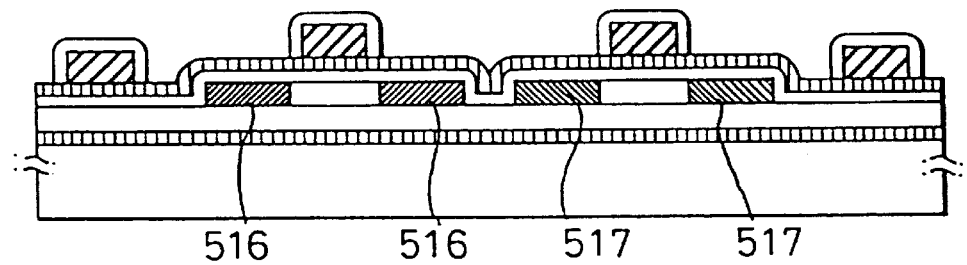

Further, current was supplied to the gate electrode/wirings 508 to 511 in the electrolyte to form aluminum oxide films 512 to 515 by the anodic oxidation method. The anodic oxidation condition as disclosed in Japanese Patent Application No. 4-30220 which was invented by the inventor of this application, et.al was adopted in this embodiment. FIG. 6(B) shows an intermediate produced in the above processes.

Subsequently, by a well-known plasma ion doping method, N-type impurity and P-type impurity were doped into the semiconductor regions 504 and 505 respectively, thereby forming an N-type impurity region (source, drain) 516 and a P-type impurity region 517. This process was carried out using the well-known CMOS technique. In the plasma, hydrogen which was used as a dilute agent for gas source was ionized together with impurity elements, and injected into the semiconductor regions. This process may be carried out by a well-known ion injection method, however, this method requires a separate injection process of hydrogen ions for the reason as described later.

Figure 6D:
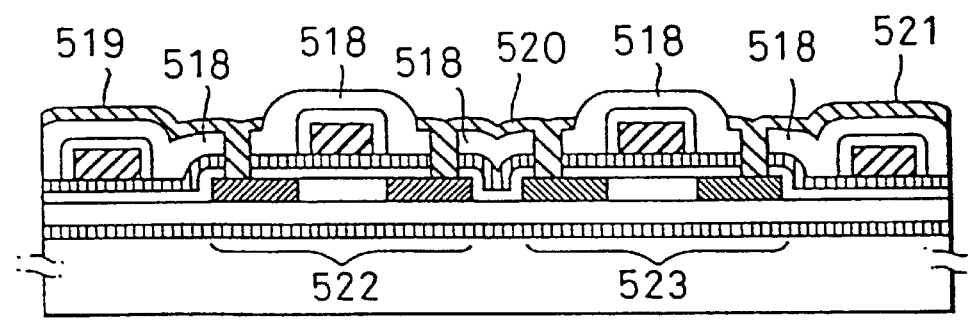

Through these processes, the structure as shown in FIG. 6(D) was obtained. Naturally, the crystallinity of the portions to which the impurities were injected by the ion injection was extremely low, and these portions were substantially in a non-crystal state (amorphous state or polycrystal state close to the amorphous state). Therefore, the crystallinity was restored by the laser annealing treatment. This process may be replaced by the heat annealing treatment at 600 to 850° C. The condition for the laser annealing treatment as disclosed in Japanese Patent Application No. 4-30220 for example was adopted. Here, no short-wavelength ultraviolet rays below 250 nm wavelength is passed through the silicon nitride film 507, so that XeCl laser (308 nm wavelength) or XeF laser (351 nm wavelength) was used.

After the laser annealing treatment, the annealing treatment was carried out for 30 minutes to 3 hours at 250 to 450° C. under hydrogen atmosphere (1 to 700 torr or 500 to 700 torr), to thereby depress lattice defects (dangling bond, etc.). Actually, delivery of hydrogen was little carried out between the inside of the semiconductor region and the outside thereof because the silicon nitride film 507 exists. Therefore, a large amount of hydrogen atoms are simultaneously injected into the semiconductor region in the plasma doping method, and on the other hand, in the ion injection method, a process of injecting hydrogen atoms is separately required. If the amount of hydrogen atoms is insufficient, hydrogen atoms are required to be separately doped even in the plasma doping method.

Through the manner as described above, the outline of the element was shaped. Afterwards, similarly in the ordinary manner, the interlayer insulator 518 was formed by the sputtering method for silicon oxide film formation, and a hole for electrode was formed by a well-known photolithography to expose the surface of the semiconductor region or the gate electrode/wiring. Finally, a second metal film (aluminum or chrome) was selectively formed to form electrode/wirings 519 to 521. Through these processes, NTFT 522 and PTFT 523 were formed.

[Embodiment 7]

FIG. 5 shows an embodiment in which this invention was applied to the TFT having two-layered channel which was invented by the inventor of this application, et.al., and described in applications filed on Feb. 25, 1992 entitled "THIN FILM INSULATING GATE TYPE OF SEMICONDUCTOR DEVICE AND A PRODUCING METHOD THEREFOR" (applicant: Semiconductor Energy Laboratory Co., Ltd, docketing numbers: P002042-01 to P002044-03).

Figure 7:
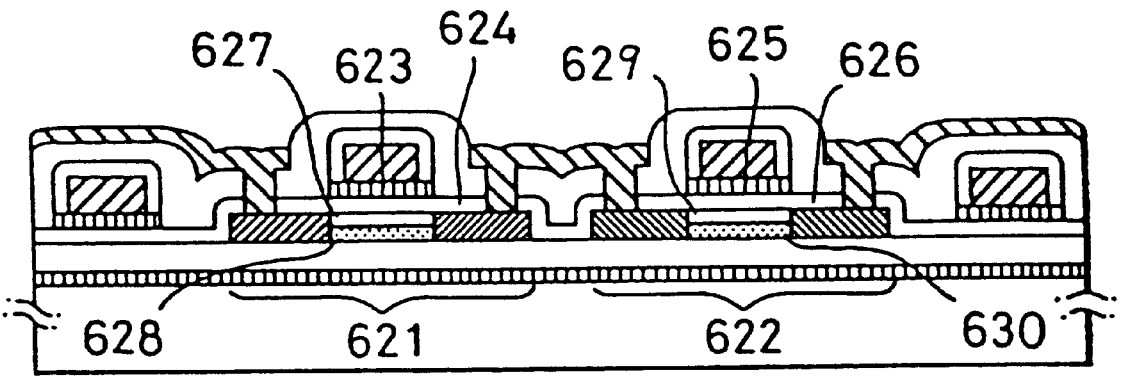
FIG. 7 shows an example of the structure of a semiconductor device according to this invention.
Figure 8:
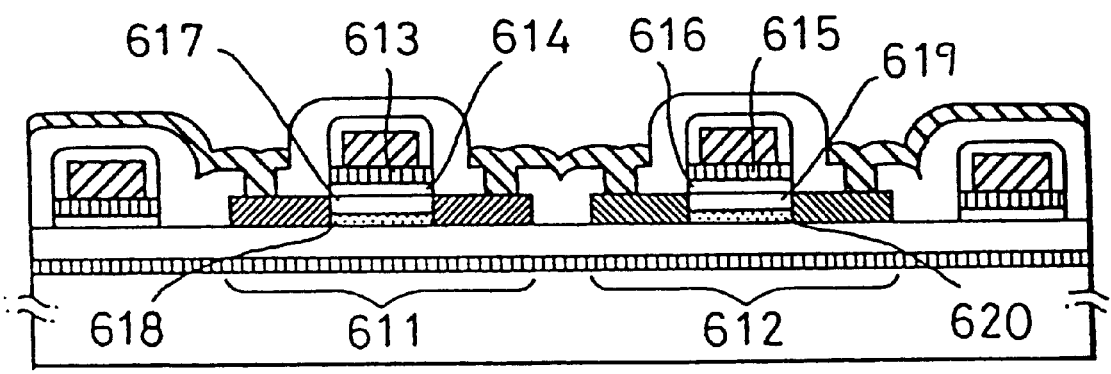
FIG. 8 shows an example of the structure of a semiconductor device according to this invention.
Figure 9:
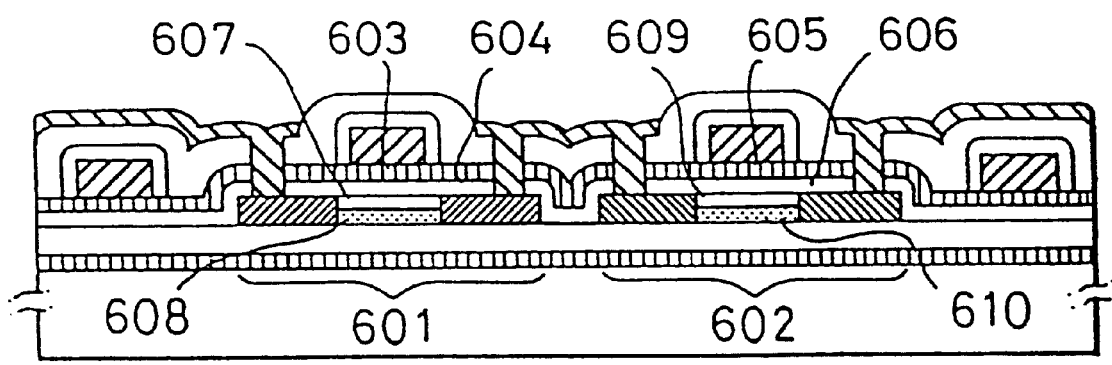
FIG. 9 shows an example of the structure of a semiconductor device according to this invention.
Figure 10:
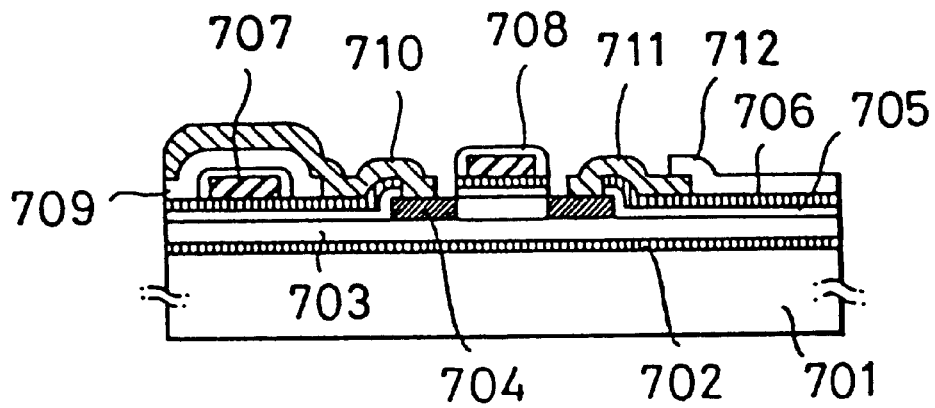
FIG. 10 is a cross-sectional view of a semiconductor device according to this invention.
Figure 11:
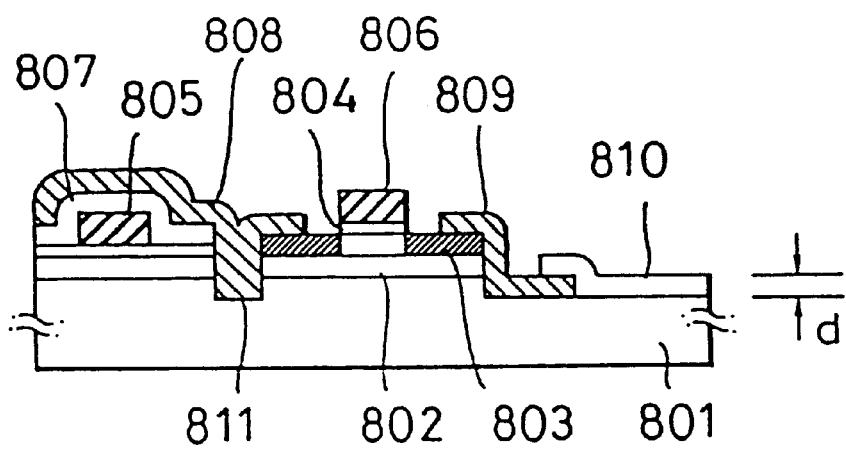
FIG. 11 is a cross-sectional view or a semiconductor device in a conventional method.
Figure 12:
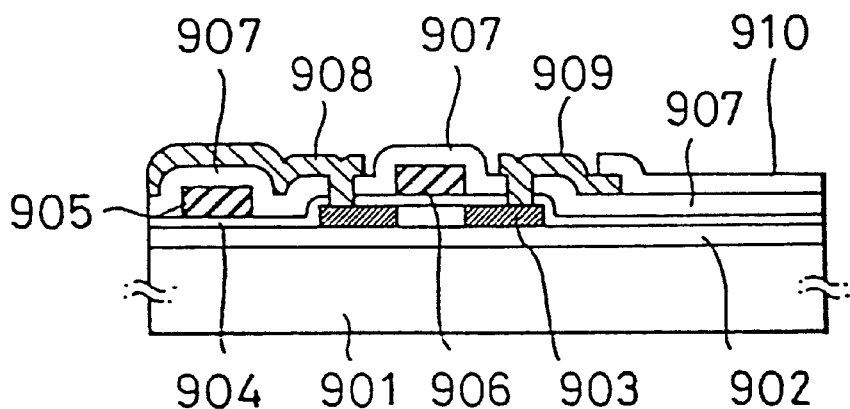
FIG. 12 is a cross-sectional view of a semiconductor device in a conventional method.

In FIGS. 7, 8 and 9, reference numerals 621, 611 and 601 represent N-channel TFTs, and reference numerals 622, 612 and 602 represent P-channel TFTs. In each figure, each first layer 628 (630, 618, 620, 608, 610) at a channel region was substantially formed of amorphous silicon. The thickness of the layer was set to 20 to 200 nm.

Reference numerals 627, 629, 617, 619, 607, 609 represent silicon layers which were substantially in a polycrystal or semi-amorphous state, and the thickness of the silicon layers were set to 20 to 200 nm. Reference numerals 624, 626, 614, 616, 604, 606 represent gate insulating films formed of silicon oxide, and the thickness thereof was set to 50 to 300 nm. Reference numerals 623, 625, 613, 615, 603, 605 represent silicon nitride films each having 2 to 20 nm thickness; which were formed in the same manner as the Embodiments 4 to 6. The construction of these elements were designed on the basis of the disclosure of the above Patent Application or the description of the Embodiment 4.

[Embodiment 8]

FIG. 13 is cross-sectional views showing a manufacturing process of this embodiment.

An N—O glass produced by Nippon Electric Glass Co., Ltd was used as a substrate 1001. This glass has high strain temperature, however, contains a large amount of lithium and natrium. Therefore, in order to prevent invasion of these movable ions from the substrate and in order to prevent the over-etching, an aluminum oxide film 1002 was formed on the substrate 1001 in thickness of 10 to 50 nm by an organic metal CVD method. Further, a silicon oxide film 1003 serving as a sealer was formed on the aluminum oxide film 1002 in thickness of 100 to 800 nm by the sputtering method. An amorphous silicon film was formed in thickness of 20 to 100 nm on the silicon oxide film 1003 by the plasma CVD method, and then annealed at 600° C. for 12 to 72 hours at nitrogen atmosphere to be crystallized. The result was subjected to the patterning process by the photolithography and the reactive ion etching (RIE) method to form islandish semiconductor regions 1004.

Subsequently, a gate oxide film (gate insulating film) 1007 was deposited over the islandish semiconductor regions 1004 in thickness of 50 to 200 nm under oxygen atmosphere using silicon oxide as a target by the sputtering method. Further, a polycrystal silicon doped with phosphorus was formed by the low pressure CVD method, and subjected to the patterning process to form a first wiring 1008 and 1009 containing a gate electrode 1009 on the gate insulating film. Through these processes, the outline of a TFT was shaped.

Subsequently, N-type impurity was doped into the semiconductor region 1004 by the well-known ion injection method to form N-type impurity regions (source, drain) 1005 and 1006. In the manner as described above, the structure as shown in FIG. 13(A) was obtained. Naturally, the crystallinity at the portion doped with the impurities by the ion injection method was extremely low, and this portion was substantially in a non-crystal (amorphous state, or polycrystal state close to the amorphous state). Therefore, the crystallinity at the portion was restored by the laser annealing treatment. This process may be replaced by the heat annealing treatment at 600 to 850° C. The laser annealing condition as disclosed in Japanese Patent Application No. 4-30220 for example was adopted. After the laser annealing treatment, the annealing treatment was carried out for 30 minutes to 3 hours at 250 to 450° C. under hydrogen atmosphere (1 to 700 torr, preferably 500 to 700 torr) to inject hydrogen atoms into the semiconductor region and depress the lattice defect (dangling bond, etc.).

Figure 13A:
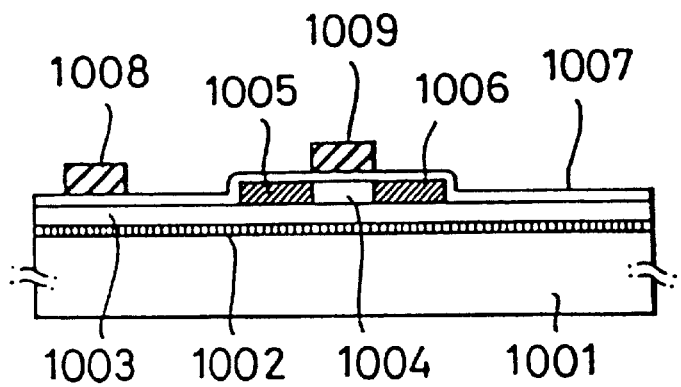
FIG. 13 shows a process for producing a semiconductor device (cross-sectional view) according to this invention.
Figure 13B:
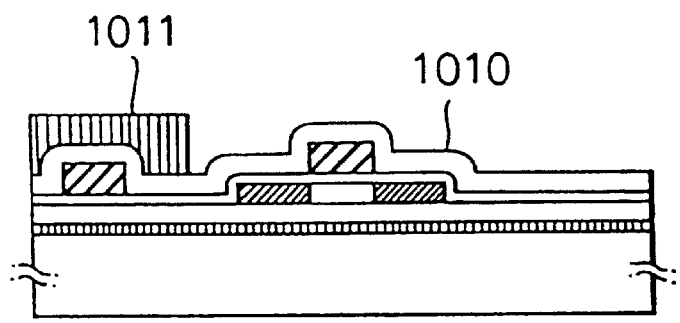

Through these processes, the outline of the element was shaped. Thereafter, an interlayer insulator 1010 was formed by the sputtering method for film formation of silicon oxide, and a mask was formed of photoresist only at the portion where the wirings were intersected. This state is shown in FIG. 13(B).

Figure 13C:
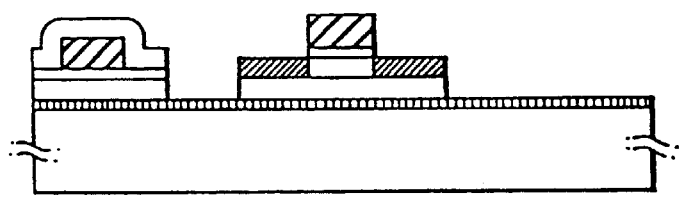
Figure 13D:
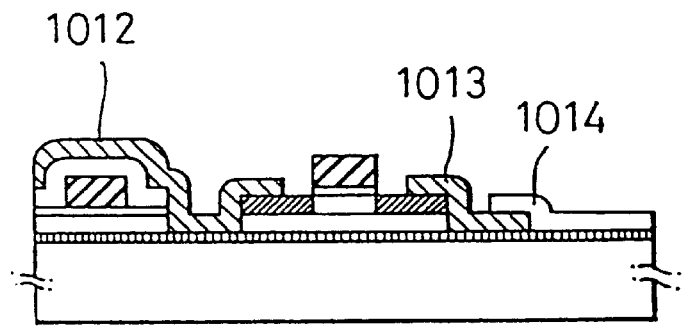

Subsequently, the wet etching treatment using hydrochloric acid was conducted with the above mask 1011 on the interlayer insulator 1010 and the gate insulating film 1007 and the silicon oxide film 1003. The aluminum oxide film 1002 was exposed by etching them with the first wiring and the islandish semiconductor region 1004 as masks. However, the substrate was subjected to no etching treatment because the aluminum oxide 1002 functioned as a barrier. Therefore, the substrate was not exposed by virtue of the aluminum oxide 1002. In addition, silicon was not etched and thus each or the gate electrode 1009 and the semiconductor region 1004 was left as it was. The surface of the impurity regions of the semiconductor region were exposed. This state is shown in FIG. 13(C).

Subsequently, an aluminum or chrome film was formed, and then subjected to the patterning process to form as a second wiring wiring/electrode 1012 and 1013 in contact with a portion of the islandish semiconductor region 1004. At this time, the impurity region of the semiconductor region was exposed, and thus it was unnecessary to provide a contact. Further, a transparent electrode 1014 was formed of ITO. Through these processes, the semiconductor device was completed. The aluminum oxide film 1002 may be replaced by a silicon nitride film.

[Embodiment 9]

FIG. 14 is cross-sectional views showing a manufacturing process of this embodiment.

An N—O glass produced by Nippon Electric Glass Co., Ltd. was used as a substrate 1101. A silicon nitride film 1102 was formed in thickness of 10 to 50 nm on the substrate by the plasma CVD method or the low pressure CVD method. Further, a silicon oxide film 1103 serving as a sealer was formed in thickness of 100 to 800 nm by the sputtering method. An amorphous silicon film was formed on the silicon oxide film in thickness of 20 to 100 nm by the plasma CVD method, and annealed at 600° C. for 12 to 72 hours at nitrogen atmosphere to crystallize the amorphous silicon film. Subsequently, this result was subjected to a patterning process to form islandish semiconductor regions 1104.

Subsequently, a gate insulating film 1105 of silicon oxide was deposited in thickness of 50 to 200 nm by the sputtering method, and then a silicon nitride film 1106 was deposited in thickness of 2 to 20 nm, preferably in thickness of 8 to 11 nm by the plasma CVD method or the low pressure CVD method.

Figure 14A:
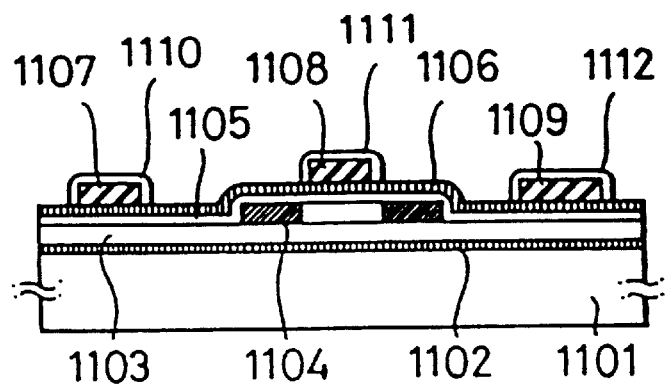
FIG. 14 shows a process for producing a semiconductor device (cross-sectional view) according to this invention.

Thereafter, an aluminum film was formed by the sputtering method or the electron beam deposition method, and then subjected to a patterning process to form gate electrode/wirings 1107 to 1109. Further, current was supplied to the gate electrode/wirings 1107 to 1109 in the electrolyte to form aluminum oxide films 1110 to 1112 by the anodic oxidation method. The anodic oxidation condition as disclosed in Japanese Patent Application No. 4-30220 which was invented by the inventor of this application, et.al was adopted in this embodiment. Further, by the laser doping technique (Japanese Patent Application No. 3-283981) which was invented by the inventor of this application, et.al, N-type impurity was doped into the semiconductor region 1104, thereby forming an N-type impurity region (source, drain). The laser doping method requires no laser annealing treatment and no heat annealing treatment which were required for the Embodiment 8 because the injection of the impurities and the annealing treatment were simultaneously carried out. After the laser doping treatment, the annealing treatment was carried out for 30 minutes to 3 hours at 250 to 450° C. under hydrogen atmosphere (1 to 700 torr or 500 to 700 torr), to thereby add hydrogen to the semiconductor region and depress lattice defects (dangling bond, etc.). This state is shown in FIG. 14(A).

Figure 14B:
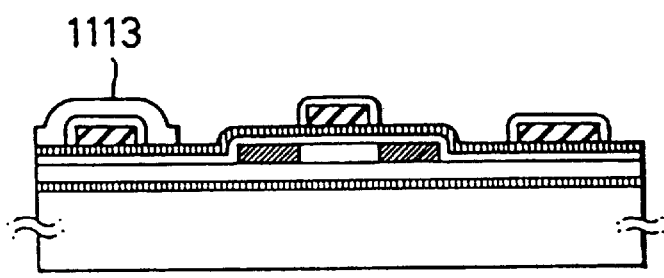

Subsequently, as shown in FIG. 14(B), an interlayer insulator 1113 of silicon oxide was formed only at a portion where the wirings were crossed. Like the Embodiment 8, the interlayer insulator at the other portions were etched with hydrofluoric acid, however, the gate electrodes/wirings 1107 to 1109 and the oxide film 1103 serving as the sealer were prevented from being etched by the anodic oxides 1110 to 1112 and the silicon nitride 1106.

Figure 14C:
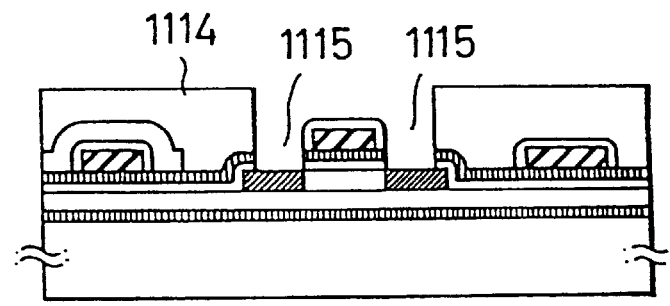

Subsequently, a photoresist was coated over the whole surface, and only the semiconductor region was exposed. The silicon nitride film and the silicon oxide at the exposed portion were removed. However, at this time, the gate electrode 1108 was not varied because the etching rate of the anodic oxide was slow. Through this process, the surface of the semiconductor region was exposed as shown in FIG. 14(C).

Figure 14D:
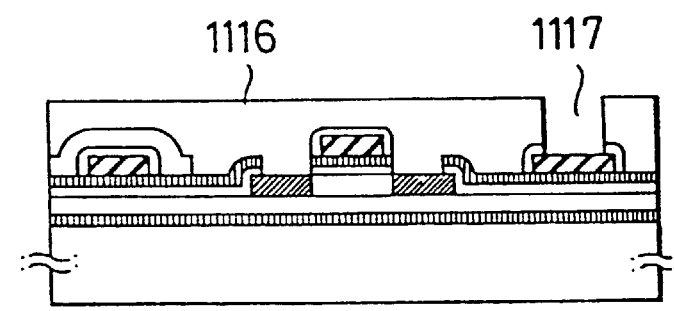

A photoresist 1116 was coated over the whole surface again, only a suitable portion of the gate wiring was exposed, and then the anodic oxide was removed by the RIE, thereby forming an electrode-formation portion. This state is shown in FIG. 14(D).

Figure 14E:
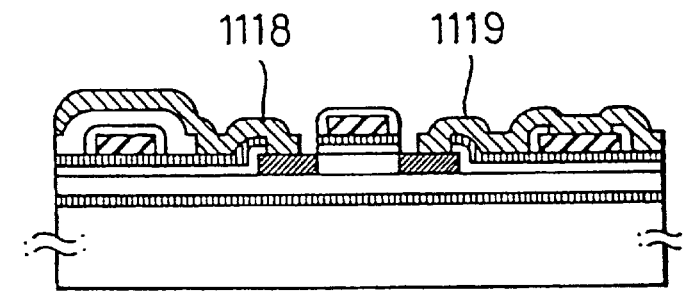

Finally, a metal film of aluminum or the like was formed, and subjected to a patterning process to form electrode/wiring 1118 and 1119. The wiring 1118 was contacted with the semiconductor region of the TFT, and the wiring 1119 was contacted with the semiconductor region of the TFT and the gate wiring 1109. This state is shown in FIG. 14(E).

As described above, according to this invention, by forming the silicon nitride film between the gate electrode and the gate insulating film, the invasion (contamination) of the movable ions can be prevented, and also the breakdown of the gate insulating film in the anodic oxidation operation of the gate electrodes can be prevented.

Further, according to this invention, the conductive film serving as a mask for anodic oxidation is selectively provided in close contact with the gate electrode/wiring, and the conductive film is removed after the anodic oxidation, so that the contact formation to the gate wirings after the anodic oxidation can be facilitated. By properly applying this technique to the anodic oxidation, a subsequent wiring connection process can be simplified.

Still further, according to this invention, the barrier layer of silicon nitride or aluminum oxide is formed, so that the over-etching can be prevented, and yield of devices can be improved. In addition, the flatness of the element can be improved, and the contact failure can be depressed.

What is claimed is:

1. An insulated gate thin film transistor comprising:
   a semiconductor layer comprising crystalline silicon formed on an insulating surface of a substrate;
   a channel region formed within said semiconductor layer;
   source and drain regions formed within said semiconductor layer with said channel region therebetween;
   a first insulating film comprising silicon oxide formed on said channel region;
   a second insulating film formed on said first insulating film; and
   a gate electrode formed over said channel region with said first and second insulating films interposed therebetween,
   said transistor characterized in that said second insulating film comprises a material selected from the group consisting of silicon nitride and aluminum oxide, and that said second insulating film extends beyond side edges of said gate electrode but does not cover a major surface of said source and drain regions,
   wherein said first insulating film is thicker than said second insulating film.

2. The transistor of claim 1 wherein said material of the second insulating film is silicon nitride.

3. The insulated gate thin film transistor according to claim 1 wherein the thickness of said first insulating film is 50 to 200 nm.

4. The insulated gate thin film transistor according to claim 3 wherein the thickness of said second insulating film is 2 to 50 nm.

5. An insulated gate thin film transistor comprising:
   a semiconductor layer comprising crystalline silicon formed on an insulating surface of a substrate;
   a channel region formed within said semiconductor layer;
   source and drain regions formed within said semiconductor layer with said channel region therebetween;
   a first insulating film comprising silicon oxide formed on said channel region;
   a second insulating film formed on said first insulating film; and
   a gate electrode formed over said channel region with said first and second insulating films interposed therebetween,
   said transistor characterized in that said second insulating film comprises a material selected from the group consisting of silicon nitride and aluminum oxide, and that said first insulating film is thicker than said second insulating film.

6. The transistor of claim 5 wherein said material of the second insulating film is silicon nitride.

7. The transistor of claim 5 wherein said first and second insulating films are coextensive with each other.

8. The insulated gate thin film transistor according to claim 5 wherein the thickness of said first insulating film is 50 to 200 nm.

9. The insulated gate thin film transistor according to claim 8 wherein the thickness of said second insulating film is 2 to 50 nm.

10. An insulated gate thin film transistor comprising:
    a semiconductor layer comprising crystalline silicon formed on an insulating surface of a substrate;
    a channel region formed within said semiconductor layer;
    source and drain regions formed within said semiconductor layer with said channel region therebetween;
    a first insulating film comprising silicon oxide formed on said channel region;
    a second insulating film formed on said first insulating film wherein said first insulating film is thicker than said second insulating film; and
    a gate electrode formed over said channel region with said first and second insulating films interposed therebetween,
    said transistor characterized in that said second insulating film comprises a material selected from the group consisting of silicon nitride and aluminum oxide, and that said second insulating film extends beyond side edges of said gate electrode but does not cover a major surface of said source and drain regions while said first insulating film covers the major surface of said source and drain regions except for contact portions thereof.

11. The transistor of claim 10 wherein said material of the second insulating film is silicon nitride.

12. The insulated gate thin film transistor according to claim 10 wherein the thickness of said first insulating film is 50 to 200 nm.

13. The insulated gate thin film transistor according to claim 12 wherein the thickness of said second insulating film is 2 to 50 nm.

14. An insulated gate field effect transistor comprising:
    a semiconductor layer comprising crystalline silicon formed on an insulating surface of a substrate;
    a channel region formed within said semiconductor layer;
    source and drain regions formed within said semiconductor layer with said channel region therebetween;
    a gate insulating film formed on said semiconductor layer; and
    a gate electrode formed over said channel region with said gate insulating film interposed therebetween, said transistor characterized in that said gate insulating film comprises at least a first insulating film comprises silicon oxide and a second insulating film comprises silicon nitride which is thinner than said first insulating film, and that at least said second insulating film extends beyond side edges of said gate electrode to cover a part of said source and drain regions.

15. The insulated gate field effect transistor according to claim 14 wherein the thickness of said first insulating film is 50 to 200 nm.

16. The insulated gate field effect transistor according to claim 15 wherein the thickness of said second insulating film is 2 to 50 nm.

17. An insulated gate field effect transistor comprising:
a semiconductor layer comprising crystalline silicon formed on an insulating surface of a substrate;
a channel region formed within said semiconductor layer;
source and drain regions formed within said semiconductor layer with said channel region therebetween;
a gate insulating film formed on said semiconductor layer; and
a gate electrode formed over said channel region with said gate insulating film interposed therebetween,
said transistor characterized in that said gate insulating film comprises at least a first insulating film comprises silicon oxide and a second insulating film comprises silicon nitride, that said first insulating film is thicker than said second insulating film.

18. The insulated gate field effect transistor according to claim 17 wherein the thickness of said first insulating film is 50 to 200 nm.

19. The insulated gate field effect transistor according to claim 18 wherein the thickness of said second insulating film is 2 to 50 nm.

20. An insulated gate field effect transistor comprising:
a semiconductor layer comprising crystalline silicon formed over a substrate;
a channel region formed within said semiconductor layer;
a pair of impurity regions formed within said semiconductor layer with said channel region therebetween;
a gate insulating film adjacent to said semiconductor layer, including at least a first insulating film comprising silicon oxide in contact with said channel region and a second insulating film comprising silicon nitride film; and
a gate electrode adjacent to said channel region with said gate insulating film interposed therebetween,
wherein at least said second insulating film extends beyond side edges of the gate electrode,
wherein said first insulating film is thicker than said second insulating film.

21. An insulated gate field effect transistor according to claim 20 wherein said pair of impurity regions are source and drain regions of the transistor.

22. An insulated gate field effect transistor according to claim 20 wherein said gate electrode is located over said channel region.

23. An insulated gate field effect transistor according to claim 20 wherein said silicon nitride film is in direct contact with said gate electrode.

24. The insulated gate field effect transistor according to claim 20 wherein the thickness of said first insulating film is 50 to 200 nm.

25. The insulated gate field effect transistor according to claim 24 wherein the thickness of said second insulating film is 2 to 50 nm.

26. An insulated gate field effect transistor comprising:
a semiconductor layer comprising crystalline silicon formed over a substrate;
a channel region formed within said semiconductor layer;
a pair of impurity regions formed within said semiconductor layer with said channel region therebetween;
a gate insulating film adjacent to said semiconductor layer, including at least a first insulating film comprising silicon oxide in contact with said channel region and a second insulating film comprising silicon nitride film; and
a gate electrode adjacent to said channel region with said gate insulating film interposed therebetween,
wherein said first insulating film is thicker than said second insulating film.

27. An insulated gate field effect transistor according to claim 26 wherein said pair of impurity regions are source and drain regions of the transistor.

28. An insulated gate field effect transistor according to claim 26 wherein said gate electrode is located over said channel region.

29. An insulated gate field effect transistor according to claim 26 wherein said silicon nitride film is in direct contact with said gate electrode.

30. The insulated gate field effect transistor according to claim 26 wherein the thickness of said first insulating film is 50 to 200 nm.

31. The insulated gate field effect transistor according to claim 30 wherein the thickness of said second insulating film is 2 to 50 nm.

32. An insulated gate field effect transistor comprising:
a semiconductor layer comprising crystalline silicon formed over a substrate;
a channel region formed within said semiconductor layer;
a pair of impurity regions formed within said semiconductor layer with said channel region therebetween;
a gate insulating film adjacent to said semiconductor layer, including at least a first insulating film comprising silicon oxide in contact with said channel region and a second insulating film comprising aluminum oxide; and
a gate electrode adjacent to said channel region with said gate insulating film interposed therebetween,
wherein, said first insulating film is thicker than said second insulating film.

33. An insulated gate field effect transistor according to claim 32 wherein said pair of impurity regions are source and drain regions of the transistor.

34. An insulated gate field effect transistor according to claim 32 wherein said gate electrode is located over said channel region.

35. An insulated gate field effect transistor according to claim 34 wherein said silicon nitride film is in direct contact with said gate electrode.

36. An insulated gate field effect transistor comprising:
a semiconductor layer comprising crystalline silicon formed over a substrate;
a channel region formed within said semiconductor layer;
a pair of impurity regions formed within said semiconductor layer with said channel region therebetween;
a gate insulating film adjacent to said semiconductor layer, including at least a first insulating film comprising silicon oxide in contact with said channel region and a second insulating film comprising silicon nitride film; and a gate electrode adjacent to said channel region with said gate insulating film interposed therebetween, wherein at least said second insulating film extends beyond side edges of the gate electrode, wherein said first insulting film is thicker than said second insulating film and the thickness of said first insulating film is 50 to 200 nm.

37. An insulated gate field effect transistor comprising:

a semiconductor layer comprising crystalline silicon formed over a substrate;

a channel region formed within said semiconductor layer;

a pair of impurity regions formed within said semiconductor layer with said channel region therebetween;

a gate insulating film adjacent to said semiconductor layer, including at least a first insulting film comprising silicon oxide in contact with said channel region and a second insulating film comprising silicon nitride film; and a gate electrode adjacent to said channel region with said gate insulating film interposed therebetween, wherein at least said second insulating film extends beyond side edges of the gate electrode, wherein said first insulating film is thicker than said second insulating film and the thickness of said second insulating film is 2 to 50 nm.

38. An insulated gate field effect transistor comprising:

a semiconductor layer comprising crystalline silicon formed over a substrate;

a channel region formed within said semiconductor layer;

a pair of impurity regions formed within said semiconductor layer with said channel region therebetween;

a gate insulating film adjacent to said semiconductor layer, including at least a first insulating film comprising silicon oxide in contact with said channel region and a second insulating film comprising silicon nitride film; and a gate electrode adjacent to said channel region with said gate insulating film interposed therebetween, wherein said first insulating film is thicker than said second insulating film and the thickness of said first insulating film is 50 to 200 nm.

39. An insulated gate field effect transistor comprising:

a semiconductor layer comprising crystalline silicon formed over a substrate;

a channel region formed within said semiconductor layer;

a pair of impurity regions formed within said semiconductor layer with said channel region therebetween;

a gate insulating film adjacent to said semiconductor layer, including at least a first insulating film comprising silicon oxide in contact with said channel region and a second insulating film comprising silicon nitride film; and a gate electrode adjacent to said channel region with said gate insulating film interposed therebetween, wherein said first insulating film is thicker than said second insulating film and the thickness of said second insulating film is 2 to 50 nm.

40. The insulated gate field effect transistor according to claim 32 wherein the thickness of said first insulating film is 50 to 200 nm while the thickness of said second insulating film is 2 to 50 nm.

41. The insulated gate field effect transistor according to claim 20 wherein said semiconductor film is 20 to 100 nm thick.

42. The insulated gate field effect transistor according to claim 26 wherein said semiconductor film is 20 to 100 nm thick.

43. The insulated gate field effect transistor according to claim 32 wherein said semiconductor film is 20 to 100 nm thick.

* * * * *